(12) United States Patent
Zhang et al.

(10) Patent No.: US 8,544,281 B2
(45) Date of Patent: Oct. 1, 2013

(54) COOLING SYSTEM AND METHOD FOR SUPERCONDUCTING MAGNETS

(75) Inventors: Tao Zhang, Clifton Park, NY (US); Xianrui Huang, Clifton Park, NY (US); Evangelos Trifon Laskaris, Schenectady, NY (US); Yan Zhao, Shanghai (CN); Paul St. Mark Shadforth Thompson, Stephentown, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 12/913,802

(22) Filed: Oct. 28, 2010

(65) Prior Publication Data

US 2011/0179809 A1 Jul. 28, 2011

(30) Foreign Application Priority Data

Oct. 30, 2009 (CN) .......................... 2009 1 0209704

(51) Int. Cl.
*F25B 9/00* (2006.01)
*F25B 19/00* (2006.01)
*F17C 3/08* (2006.01)

(52) U.S. Cl.
USPC ................................. 62/51.1; 62/6; 62/45.1

(58) Field of Classification Search
USPC ........................................................ 62/51.1
See application file for complete search history.

(56) References Cited

U.S. PATENT DOCUMENTS

| | | | |
|---|---|---|---|
| 4,680,936 A * | 7/1987 | Sarwinski et al. ............. | 62/45.1 |
| 5,513,489 A | 5/1996 | Bussing | |
| 5,513,498 A | 5/1996 | Ackermann et al. | |
| 5,782,095 A * | 7/1998 | Chen .............................. | 62/47.1 |
| 6,923,009 B2 | 8/2005 | Kudaravalli | |
| 6,995,562 B2 | 2/2006 | Laskaris et al. | |
| 7,449,889 B1 | 11/2008 | Huang et al. | |
| 7,464,558 B2 | 12/2008 | Huang et al. | |
| 2005/0252219 A1 | 11/2005 | Van Hasselt | |
| 2007/0101742 A1 * | 5/2007 | Laskaris et al. .............. | 62/259.2 |
| 2007/0245749 A1 * | 10/2007 | Atkins et al. ................... | 62/51.1 |

(Continued)

FOREIGN PATENT DOCUMENTS

| | | |
|---|---|---|
| CN | 1080711 A | 1/1994 |
| CN | 2566196 Y | 8/2003 |
| CN | 1653564 A | 8/2005 |

OTHER PUBLICATIONS

Pant, et al., "Development of Low-Oxide MCrAlY Coatings for Gas Turbine Applications", Journal of thermal Spray Technology, vol. 16(2) Jun. 2007 p. 275-280.

(Continued)

*Primary Examiner* — Frantz Jules
*Assistant Examiner* — Keith Raymond
(74) *Attorney, Agent, or Firm* — Global Patent Operation; Mark A. Conklin (57) ABSTRACT

A method for cooling a superconducting magnet enclosed in a cryostat includes introducing a gas into a cooling path in the cryostat from an input portion into a cooling path cooled by a refrigerator outside the cryostat. A heat exchanger inside the cryostat above the magnet cools the gas. The cooled gas flows through a magnet cooling tube contacting the magnet. The cooled gas removes heat from the magnet, and to the heat exchanger to re-cool and return to the superconducting magnet, thereby cooling and/or maintaining the magnet at a superconducting temperature.

17 Claims, 7 Drawing Sheets

(56) References Cited

U.S. PATENT DOCUMENTS

2009/0162670 A1    6/2009  Lau et al.
2009/0275478 A1*  11/2009  Atkins et al. ............... 505/163
2010/0005814 A1*   1/2010  Strobel ....................... 62/62

OTHER PUBLICATIONS

Lugscheider, et al., "High Power Plasma Spraying of Oxide Ceramics", Proceedings of the 8th National Thermal Spray Conference, Sep. 11-15, 1995, Houston, Texas, pp. 333-337.

Lugscheider, et al., Coaling Morphologies of Supersonic Plasma-Sprayed Stabilized Zirconium Oxides, Surface and Coatings Technology, 30 (1987) 29-40.

Ke, et al., "Study on Thermal Barrier Coatings Deposited by Detonation Gun Spraying", Surface & Coating Technology 200 (2005) 2271-2276.

Morishita T., Plazjet Ltd., Tokyo/Japan, "Coatings by 250 KW Plasma Jet Spray System", 2nd. Plasma-Technik-Symposium, vol. 1, 137-142.

Zhu, et al, "High-Performance Ceramic Coatings Sprayed via Novel Supersonic Plasma Spraing System", Key Engineering Materials vols. 280-283 (2005) pp. 1203-1206.

Han, Zhihai, et al., "A Comparison of Thermal Shock Behavior Between Currently Plasma Spray and Supersonic Plasma Spray $CeO_2$-$Y_2O_3$-$ZrO_2$ Graded Thermal Barrier Coatings", Surface & Coatings Technology 201 (2007) 5253-5256.

Unofficial translation of First Office Action from CN Application No. 200910209704.9 dated Dec. 23, 2011.

Unofficial translation of Second Office Action and Search Report from CN Application No. 200910209704.9 dated Aug. 22, 2012.

* cited by examiner

COOLING SYSTEM AND METHOD FOR SUPERCONDUCTING MAGNETS

BACKGROUND

1. Technical Field

Embodiments of the invention relate to the cooling systems and methods for superconducting magnets, and, more particularly, to a cooling system and method for cooling a superconducting magnet from a higher temperature to a superconducting temperature.

2. Discussion of Related Art

Superconducting magnets conduct electricity without resistance as long as the magnets are maintained at a suitably low temperature, which is referred to as "superconducting temperature" herein after. Accordingly, when a power source is initially connected to the superconducting magnet coils for a period to introduce a current flow through the magnetic coils, the current will continue to flow through the coils after power is removed due to the absence of electrical resistance in the coils, thereby maintaining a strong magnetic field in for example, a magnet resonance imaging (MRI) system.

Cooling systems are used for maintaining the superconducting magnets below the superconducting temperature. One conventional cooling system for the superconducting magnet comprises a liquid cryogen vessel storing a liquid cryogen, such as liquid helium, immersing the superconducting magnet. At the beginning of a cooling operation using such a conventional cooling system, liquid helium is continuously filled into the liquid cryogen vessel. The superconducting magnet is cooled from a high temperature, such as a room temperature, to the superconducting temperature by the latent heat and sensible energy of continuously boiling off the liquid helium into vapor or gaseous helium, and the helium gas typically vents out into the atmosphere during such a process and is difficult to recycle or reuse. Further, the transfer of liquid helium into the liquid cryogen vessel requires bulky filling accessories and specialized cryogenic service personal.

It may be desirable to have a cooling system that differs from those systems that are currently available which has a simpler cryogen transmission system.

BRIEF DESCRIPTION

In accordance with one embodiment, a method for cooling a superconducting magnet enclosed in a cryostat of a magnetic resonance imaging system is provided. The method comprises introducing a gas into a cooling path in the cryostat from an input portion outside the cryostat. A heat exchanger in the cooling path is cooled by a refrigerator outside the cryostat. The gas at the heat exchanger is cooled as a cold gas or, is condensed at the heat exchanger into a liquid cryogen. The cold gas or liquid cryogen from the heat exchanger flows through at least a connection tube to a magnet cooling tube, which is in thermal contact with the superconducting magnet. Heat from the superconducting magnet is removed by warming the cold gas into warm gas or by the boiling the liquid cryogen into boiled-off gas. The warm gas or boiled-off gas is transmitted back to the heat exchanger to re-cool the warm gas or re-condense the boiled-off gas for further cooling the superconducting, magnet to a superconducting temperature. The input portion is closed to make the cooling path as a closed-loop for maintaining the superconducting magnet below the superconducting temperature.

In accordance with another embodiment, a cooling system for a superconducting magnet is provided. The system comprises a first sub-assembly and a second sub-assembly. The first sub-assembly comprises a first-stage heat exchanger communicating with a first inlet portion through a connection tube, a liquid container communicating with the first-stage heat exchanger through a connection tube, a first type of cryogen in the first sub-assembly, and a thermal link having one end thermally contacting with the first liquid container and another end thermally contacting with the superconducting magnet. The second-subassembly comprises a second-stage heat exchanger communicating with a second inlet portion through a connection tube, and a magnet cooling tube having a cryogen passage and thermally contacting the superconducting magnet. The magnet cooling, tube has at least one opening fluidly coupled with the second-stage heat exchanger through connection tubes. The second sub-assembly further comprises a second type of cryogen flowing through the magnet cooling tube. The first and second cryogens are different.

BRIEF DESCRIPTION OF THE DRAWING FIGURES

These and other features, aspects, and advantages of the present invention will become better understood when the following detailed description is read with reference to the accompanying drawings in which like characters, represent like parts throughout the drawings, wherein.

DETAILED DESCRIPTION

Embodiments of the invention relate to a cooling system for a superconducting magnet used, for example, in magnetic resonance applications comprising magnetic resonance imaging or magnetic resonance spectroscopy. Embodiments of the invention relate to a cooling method for cooling superconducting magnet to a superconducting temperature of the magnet.

Figure 1:
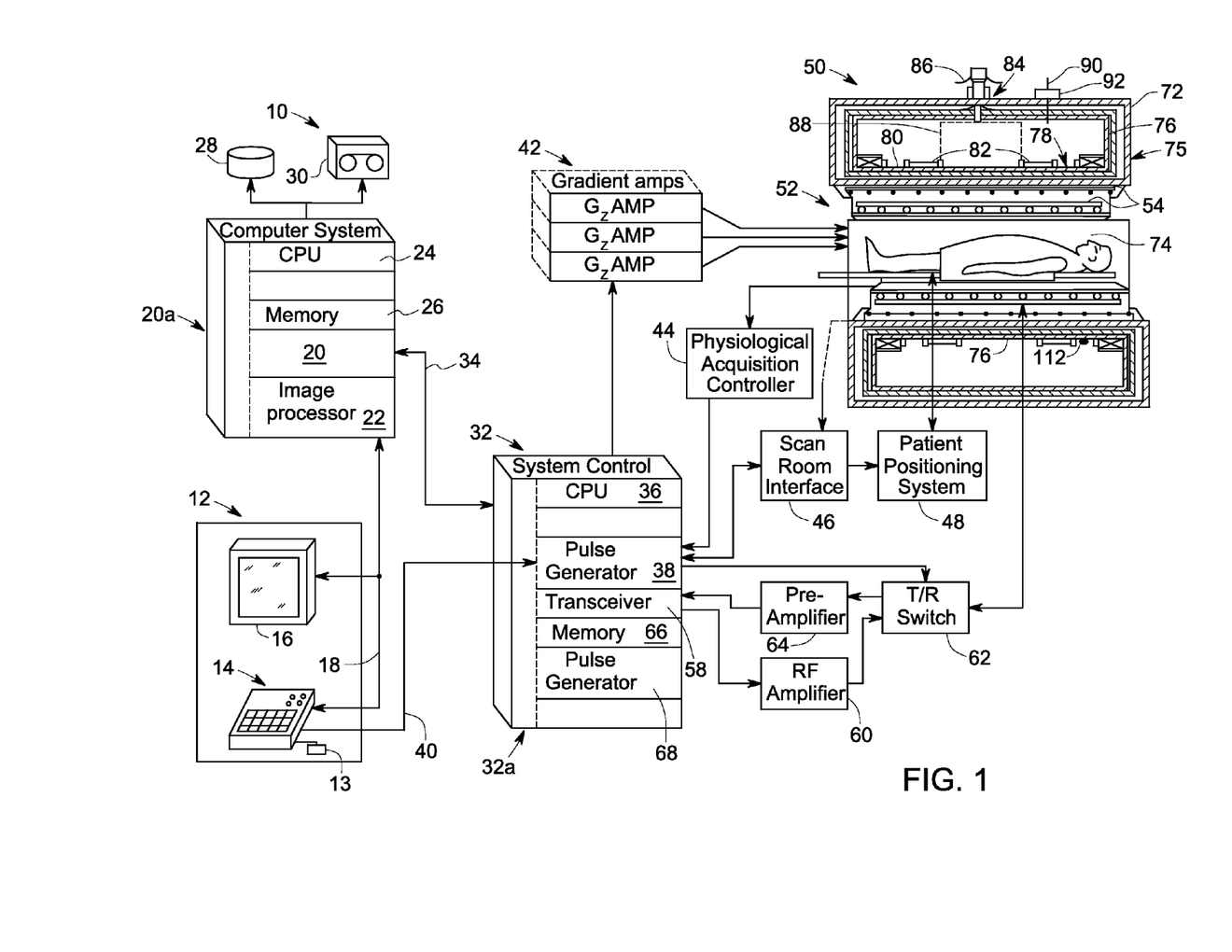
FIG. 1 illustrates a schematic block diagram of a magnetic resonance imaging (MRI) system comprising a superconducting magnet and a cooling system for the superconducting magnet according to certain embodiments of the invention.

Referring to FIG. 1, an exemplary magnetic resonance imaging (MRI) system 10 according to one embodiment comprises an operator console 12 for an operator to control operation of the system 10. The exemplary operator console 12 includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20*a*. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

In the illustrated embodiment, the system control 32 includes a set of modules connected together by a backplane 32*a*. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the radio frequency (RF) pulses produced, and the timing and length of the data acquisition window.

The pulse generator module 38 connects to a set of gradient amplifiers 42 to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. The pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan. The gradient waveforms produced by the pulse generator module 38 are applied to the gradient amplifier system 42 having Gx, Gy, and Gz amplifiers.

The magnet assembly 50 includes a gradient coil assembly 52, a polarizing magnet 54, and a whole-body RF coil 56. Each gradient amplifier excites a corresponding physical gradient coil in the gradient coil assembly 52 to produce the magnetic field gradients used for spatially encoding acquired signals. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the RF coil 56 during the transmit mode and to connect the preamplifier 64 to the coil 56 during the receive mode. The transmit/receive switch 62 can also enable a separate RF coil (for example, a surface coil) to be used in either transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 here it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

In the illustrated embodiment, the magnet assembly 50 also includes a vacuum vessel 72 defining a bore 74. As will be appreciated by those skilled in the art, in an imaging application, a subject is placed in the bore 74 for imaging. Thus, the bore 74 provides access to the imaging volume for a subject.

The MRI system 10 comprises a thermal, shield 76 disposed within the vacuum vessel 72, and a superconducting magnet 78 is disposed within the thermal shield 76 by mechanical support structures, which are not shown. The thermal shield 76 thermally isolates the superconducting magnet 78 from the ambient temperature. One embodiment of the superconducting magnet 78 includes a cylindrical bobbin 80 and a plurality of superconducting magnet coils 82 wound on an outer surface of the cylindrical bobbin 80. In certain embodiments, the bobbin 80 may be made of electrically non-conductive material, such as plastic, and the like. The superconducting coils 8Z which may be made of a coil of superconducting wires, such as of NbTi, $Nb_3Sn$ and $MgB_2$ wires, or BSCCO and YBCO types.

As is known in the art, the superconducting magnets conduct electricity with no resistance as long as the magnets are maintained below a suitably low temperature, which is referred to as "superconducting temperature" herein after. The MRI system 10 further comprises a cooling system 84 for cooling the superconducting magnet 78 from a high temperature, such as a room temperature, to or below the superconducting temperature of the magnet 78. The vacuum vessel 72 and the thermal shield 76 together contribute to maintain the low temperature environment for the superconducting magnet 78 and are referred to as a "cryostat 75" herein after. In other embodiments, the cryostat 75 for the superconducting magnet 78 may have different configurations and is not limited to the embodiment shown.

As is illustrated in the embodiment of FIG. 1, the cooling system 84 comprises a refrigerator 86 outside the thermal shield 76 that is operated to provide a cooling source to the cooling system 84. A cooling path 88, thermally coupled to the refrigerator 86, is arranged within the thermal shield 76 for transmitting a cryogen. The cooling system 84 further comprises an input portion 90 extending through the cryostat 75 for introducing a gas into the cooling path 88 for cooling the superconducting magnet 78 from the high temperature to the superconducting temperature. In the illustrated embodiment, the refrigerator 86 is mounted on an upper portion of an outer surface of the cryostat 75. In the illustrated embodiment, the input portion 90 is also defined in an upper portion of the outer surface of the cryostat 75 and is operated by a valve 92 in an open status to introduce the gas into the cooling path 88, or in a closed status to stop introducing the gas into the cooling path 88. In one embodiment, the input portion is also an output portion of the cooling path 88 operated by the valve to release gas when the gas pressure, in the cooling path 88 is too high. Detailed arrangements of the cooling path 88 according to difference embodiments are illustrated in FIGS. 2 and 5-8.

Figure 2:
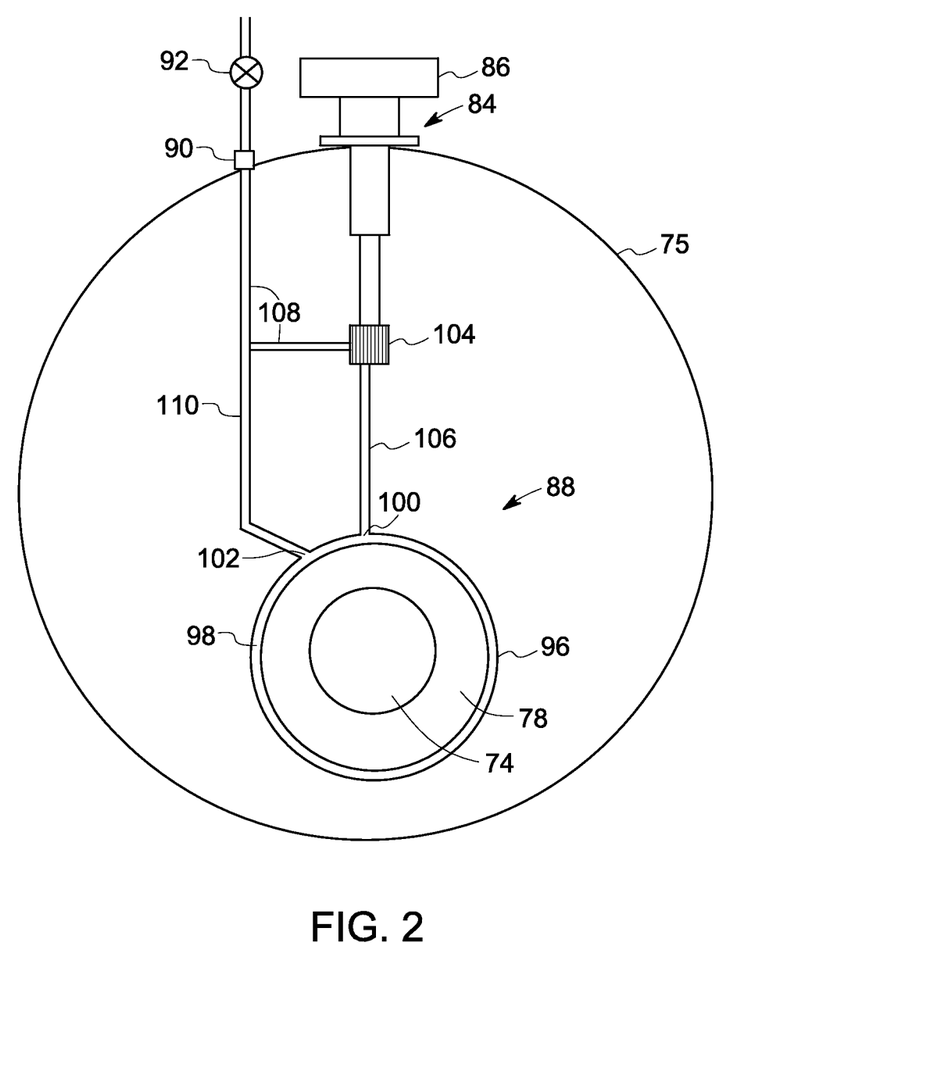
FIG. 2 illustrates a cross-sectional view of the cooling system in FIG. 1 according to one embodiment of the invention.

FIG. 2 illustrates a cross-sectional view of the cooling path 88 according to one embodiment. It is understood that the illustrated view is very exaggerated for purposes of illustration and is not drawn to scale. In the illustrated embodiment, the cooling path 88 comprises a magnet cooling tube 96 thermally coupled with the superconducting magnet 78. The magnet cooling tube 96 comprises stainless steel, aluminum, copper or brass for example and comprises a cryogen passage 98 for flowing a cryogen, and a first opening 100 and a second opening 102 for introducing into and/or exiting the cryogen from the cryogen passage 98. In the illustrated embodiment, the cooling path 88 comprises a heat exchanger 104 in fluid connection with the first opening 100 of the magnet cooling tube 96 through a connection tube 106, and is associated with the refrigerator 86. In the illustrated embodiment, the heat exchanger 104 is located above the magnet cooling tube 96, and the connection tube 106 is oriented in a substantially vertical orientation. In the illustrated embodiment, the refrigerator 86 extends through the cryostat 75 downwardly.

In the illustrated embodiment, the heat exchanger 104 communicates with the input portion 90 through a connection tube 108 for receiving a gas from the input portion 90 during a start-up operation of the cooling system 84 for cooling the superconducting magnet 76 from the high temperature down to the superconducting temperature. In the illustrated embodiment, the heat exchanger 104 is located below the input portion 90, and the connection tube 108 is oriented substantially vertically. In the illustrated embodiment, the connection tube 108 is configured as an L-shape. In other embodiments, the connection tube 108 may have a curve or and oblique configuration directed from the upper input portion 90 to the lower heat exchanger 104.

In certain embodiments, the second opening 102 of the magnet cooling tube 96 is also in fluid communication with the heat exchangers 104. In the illustrated embodiment, the cooling path 88 comprises a connection tube 110 interconnecting the second opening 102 with the connection tube 108 which interconnects the input portion 90 and the heat exchanger 104. Accordingly, the magnet cooling tube 96 communicates with both the input portion 90 and the heat exchanger 104 through the second opening 102 and the connection tubes 108, 110. In certain embodiments, the connection tubes 106, 108, 110 comprises stainless steel, aluminum, copper or brass for example.

During the start-up operation of the cooling system 84, the gas is initially introduced into the cooling path 88 through the connection tube 108. In certain embodiments, the gas may be nitrogen, neon, hydrogen, helium, or a combination of such gases, or any other suitable gas capable of withdrawing sufficient heat from the superconducting magnet. In one embodiment, the gas is at high pressure ranging from 100 psi to 450 psi. In one embodiment the gas is high-pressure helium with a pressure of about 250 psi. In one embodiment the gas is added to the cooling path 88 by a pump.

In certain embodiments, during the start-up operation of the cooling system 84, the refrigerator 86 is powered on, and the heat exchanger 104 is cooled to a much lower temperature by the refrigerator 86. In certain embodiments, at least a part of the initially charged gas flows to the heat exchanger 104 through the connection tub 108, and is cooled by the heat exchanger 104 to a cold gas. Driven gravity by the force, the cold gas flows through the connection tube 106 and the first opening 100 into the cryogen passage 98 of the magnet cooling tube 90. In one embodiment, when the cold gas is in thermal contact with the warm magnet 78 through the magnet cooling tube 96, it absorbs heat from the magnet and warms up as a warmed gas. Driven by the buoyancy force, the warmed gas flows up through the second opening 102 and connection tubes 110 and 108 and returns to the heat exchanger 104. At the heat exchanger 104; the warmed gas is cooled back into a cold gas, which again flows down to the magnet cooling tube 96 through connection tube 106. This process continues to gradually cool the connection tubes 106, 110, the magnet cooling tube 96, and the superconducting magnet 78 to a very low temperature close, to a liquefaction temperature of the gas.

In certain embodiments, the start-up operation of the cooling system 84 continues, the gas is condensed to liquid by the heat exchanger 104. Driven by the gravity force, the liquid cryogen flows through the connection tube 106 and the first opening 100 into the magnet cooling tube 96. The superconducting magnet 78 is then cooled by the latent heat of vaporization from the boiling off of the liquid cryogen into the gaseous cryogen. The boiled-off gas is transmitted through the magnet cooling tube 96 and the connection tube 110 back to the heat exchanger 104 to be re-condensed into liquid cryogen for further heat removal. The boiling-off and re-condensing processes continue until the superconducting magnet 78 is cooled to or below its superconducting temperature, and the start-up operation of the cooling system 84 ends. In one embodiment, when the start-up operation stops, the superconducting magnet 78 remains cooled by the re-condensing and boiling-off processes of the cryogen that already filled in the cooling path 88 during a normal cooling operation. In one embodiment, gas is added into the cooling path 88 through the input portion 90 until the magnet cooling tube 96 is full of liquid cryogen. Accordingly, the superconducting magnet 78 can stay at its operating temperature for a longer time when the refrigeration source 86 is not available during maintenance for example, which is refereed to as "ride-through capacity" herein after.

In one embodiment, after the input portion 90 is closed, the cooling path 88 becomes a closed-loop path. The superconducting magnet is maintained at the low temperature by the re-condensing and boiling-off processes of the cryogens in the path.

Figure 3:
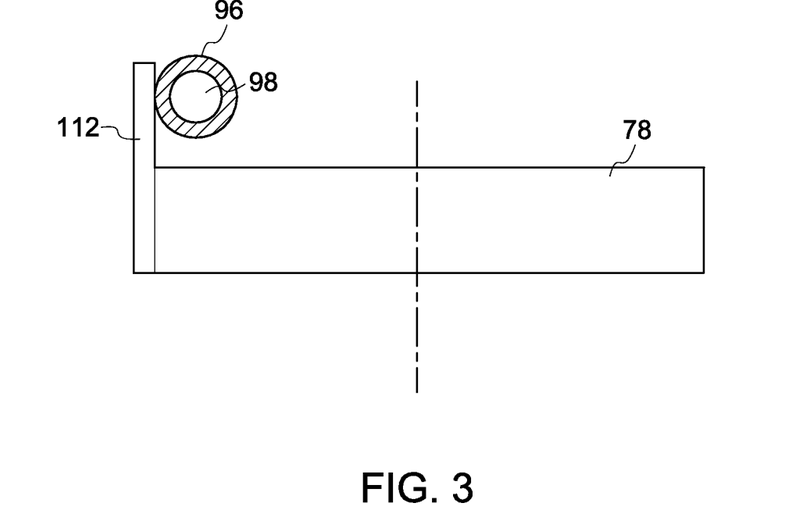
FIG. 3 illustrates a cross-sectional view of a magnet cooling tube of the cooling system in FIG. 2, which is in thermal contact with the superconducting magnet according to, one embodiment of the invention.
Figure 4:
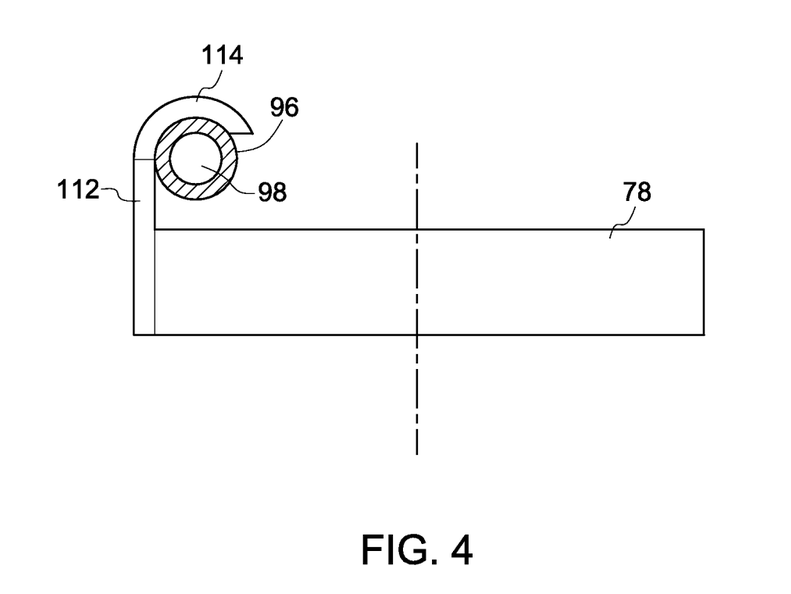
FIG. 4 illustrates a cross-sectional view of the magnet cooling tube of the cooling system in FIG. 2, which is in thermal contact with the superconducting magnet according to another embodiment of the invention.

Exemplary embodiments of the thermal connection of the magnet cooling tube 96 and the superconducting magnet 78 are illustrated in FIGS. 3 and 4. In the embodiment of FIG. 3, a heat exchange plate 112 is bonded on an outer surface of the superconducting magnet by an epoxy for example. In certain embodiments, the heat exchange plate 112 comprises a high thermal conductive material, such as copper or aluminum. In certain embodiments, the epoxy comprises a high thermal conductivity filler material such as $Al_2O_3$, or AlN for example. In the illustrated embodiment, the magnet cooling tube 96 is bonded to the heat exchange plate 112 by the epoxy, and is along a circumferential direction of the superconducting magnet 78. The illustrated magnet cooling tube 96 comprises a circular cross-section. In other embodiment, the tube 96 may have a square-shape or a triangle cross-section, with one surfaced to the heat exchange plate 112 to have an increased contact area with the heat exchange plate 112.

In the embodiment of FIG. 4, the cooling system 84 further comprises a thermal conduction member 114 bonded to the heat exchange plate 112, and has an inner surface matching and in contact with at least a portion of the outer surface of the magnet cooling tube 96. In one embodiment, the heat exchange plate 112 and the thermal conduction member 114 are one part made of flat litz wires with good flexibility to be bent and wrapped about the outer surface of the magnet cooling tube 96. The litz wire is advantageous as having a low eddy current loss when exposed to an a.c. magnetic field due to its very fine, filament size.

Figure 5:
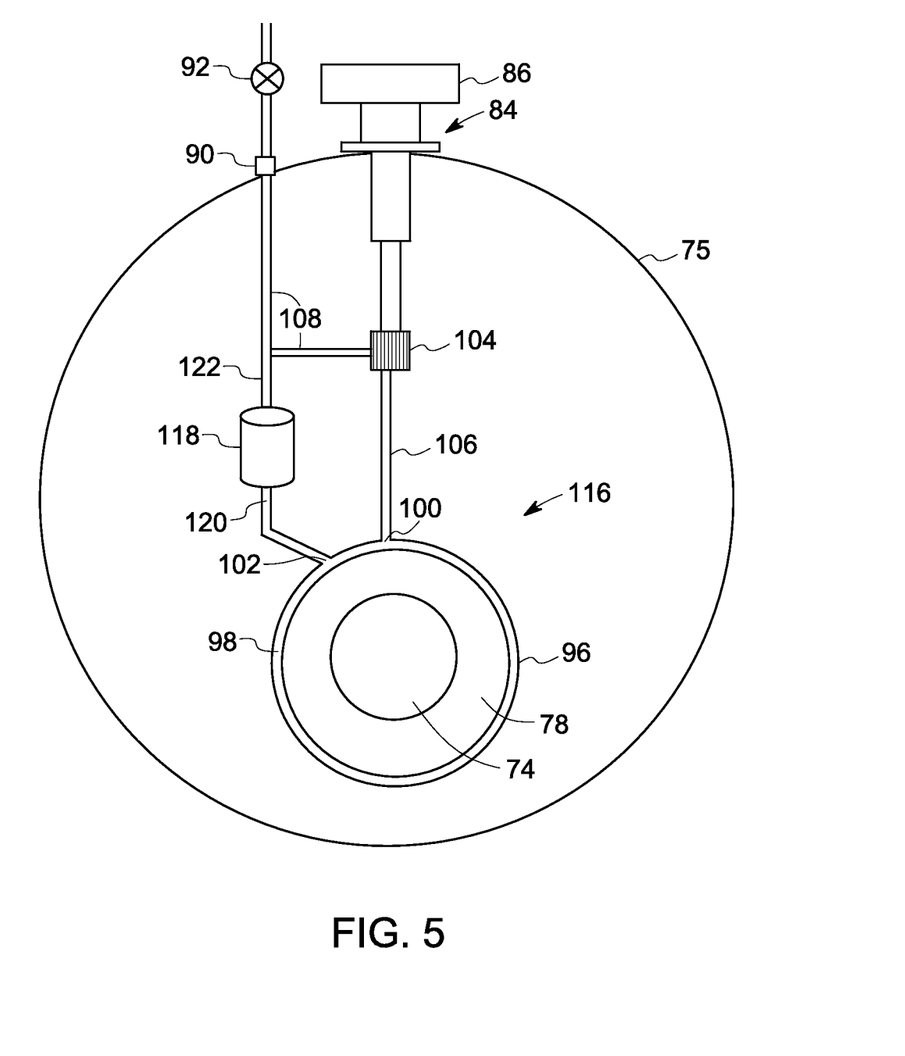
FIG. 5 is a cross-sectional view of the cooling system in FIG. 1 according to another embodiment of the invention.

Referring to FIG. 5, a cooling path 116 according to another embodiment of the invention is shown. In FIG. 5, cooling path 116 comprises a cryogen reservoir 118 located between the heat exchanger 104 and one of the first and second openings 100, 102 of the magnet cooling tube 96. In the illustrated embodiment, the cryogen reservoir 118 communicates with the second opening 102 by a connection tube 120 and communicates with the connection tube 108 through a connection tube 122 which communicates with the heat exchanger 104. Accordingly, during the start-up operation of the cooling system, the high-pressure warm gas after absorbing heat from the superconducting magnet 78 flows through the second opening via the connection tube 120, cryogen reservoir 118, connection tube 122, and connection tube 108 to the heat exchanger 104 to be re-cooled into the cold gas. The cold gas flows through connection tube 106 into the magnet cooling tube 96 to further cool the superconducting magnet 78. After the superconducting magnet 78 has been cooled close to the liquefaction temperature of the gas, the gas is <condensed into liquid cryogen at the heat exchanger 104. The liquid cryogen first fills up the magnet cooling tube 96 and then continuously fills up the cryogen reservoir 118 at the end of the start-up operation. The cryogen reservoir 118 enables the cooling system to contain more liquid cryogen, and thus enhances the ride-through capacity of the cooling path 116. In one embodiment, the cooling path may comprise more than one cryogen reservoir 118.

Figure 6:
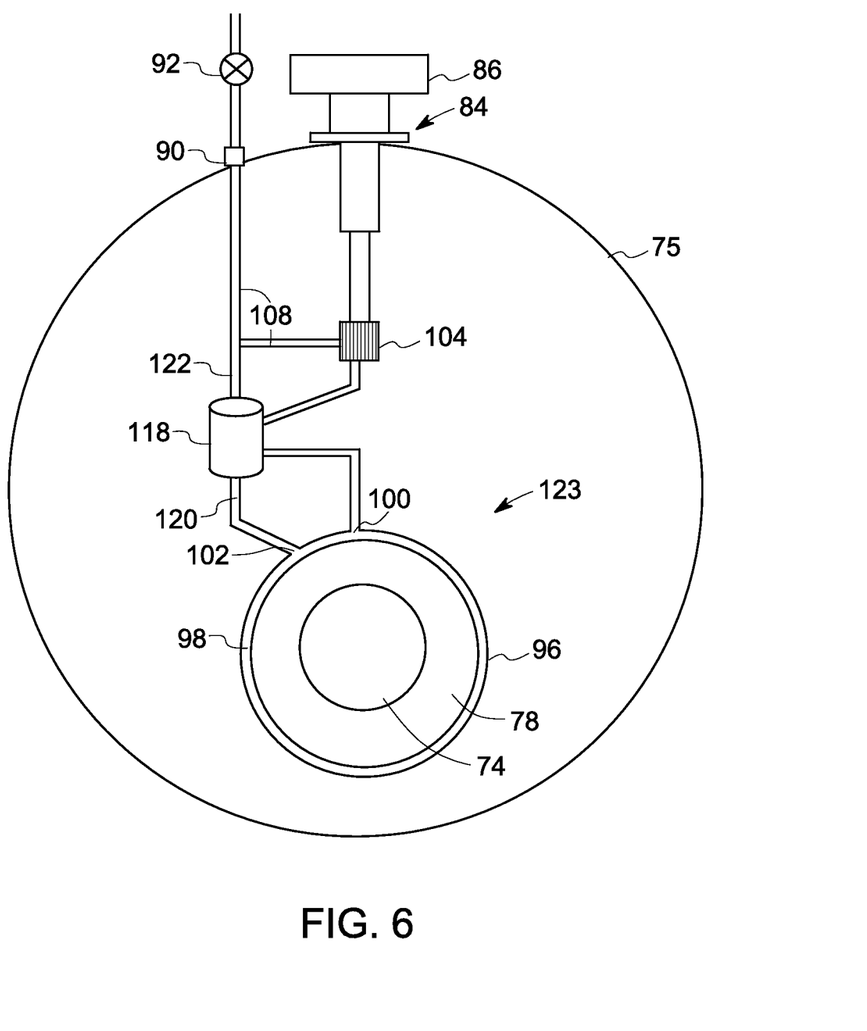
FIG. 6 is a cross-sectional view of the cooling system in FIG. 1 according to yet another embodiment of the invention.

FIG. 6 illustrates a cross-sectional view of the cooling system 84 in FIG. 1, which comprises a cooling path 123 according to yet another embodiment of the invention. In the embodiment of FIG. 6, the cryogen reservoir 118 of the cooling path 123 is located between the magnet cooling tube 96 and the heat exchanger 104, and interconnects with both the first and second opening 100, 102 of the magnet cooling tube 96 through connection tubes. The cold gas from the heat exchanger 104 flows into the magnet cooling tube 96 through the cryogen reservoir 118, while the gas warmed up by the superconducting magnet 78 flows back to the heat exchanger 104 through the cryogen reservoir 118.

Figure 7:
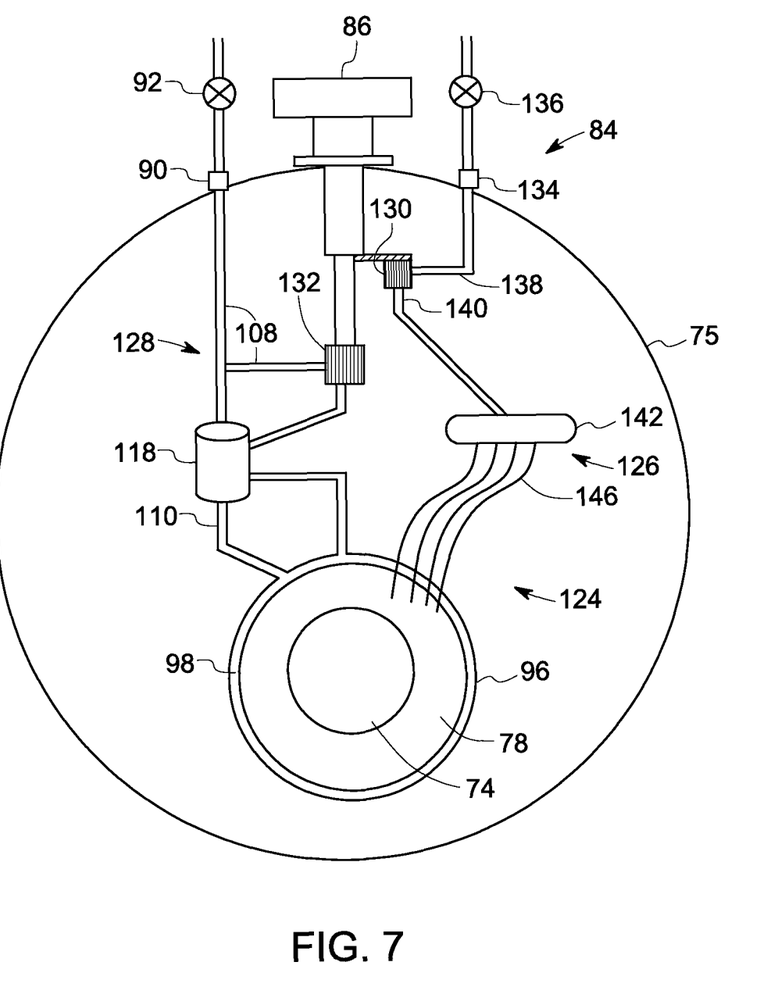
FIG. 7 is a cross-sectional view of the cooling system in FIG. 1 according to still another embodiment of the invention.

Referring to FIG. 7, the cooling system 84 according to still another embodiment of the invention comprises a two-stage cooling system comprising a first sub-assembly 126 and a second sub-assembly 128 both thermally contacting the superconducting magnet 76. In the illustrated embodiment, the first and second sub-assemblies 126, 128 each comprises a first-stage heat exchanger 130 and a second-stage heat exchanger 132 operating at different temperatures. In one embodiment, the first-stage heat exchanger 130 is normally maintained at a relatively higher temperature such as 50 Kevin (K) for example, and the second-stage heat exchanger 132 is normally maintained at a relatively lower temperature such as 4.2 K for example. Accordingly, during the start-up operation of the cooling system, the superconducting magnet is first cooled close to the temperature of the first-stage heat exchanger 130 by the first sub-assembly 126, and is then further cooled to the lower temperature of the second-stage heat exchanger 132 by the second sub-assembly 128. In the illustrated embodiment, the second sub-assembly 128 has a cooling path having a similar configuration of the cooling path of FIG. 6 and comprising the magnet cooling tube 96 thermally coupled to the superconducting magnet 78, the second-stage heat exchanger 132 fluidly coupled to the magnet cooling tube 96 for cooling or condensing the warmed-up or boiled-off gas, and the cryogen reservoir 118 fluidly coupled to the magnet cooling tube 96 and the heat exchanger 104 through connection tubes. In other embodiments, the cooling path of the second sub-assembly 128 may have a similar configuration to that of the cooling paths 88 or 116 as described with reference to FIGS. 2 and 5.

In the illustrated embodiment of FIG. 7, the first subassembly 126 comprises a first input portion 134 outside the cryostat 75 and operated by a valve 136 for introducing a gas into the first subassembly 126. The first-stage heat exchanger 130 receives the gas through a connection tube 138 and cools the gas down or converts the gas into liquid. A liquid cryogen container 142 is fluidly coupled to the heat exchanger 130 through a connection tube 140 for receiving the denser cold gas or storing the liquid cryogen from the heat exchanger. The first subassembly 126 further comprises a thermal link 146 having one end thermally contacting with the liquid cryogen container 142 and another end thermally contacting with the superconducting magnet 78. In one embodiment, the thermal link 146 comprises a thermally conducting plate wrapped on the outer surface of the superconducting magnet 76. Alternatively, the thermal link may comprise a thermally conducting plate built inside the superconducting magnet 76.

In one embodiment, the gases introduced into the first and second sub-assemblies 126 and 128 from the input portions 90 and 134, respectively, are different types of gases with different liquefaction temperatures and different freezing temperatures. In certain embodiments, the gas introduced into the first sub-assembly 126 has a higher liquefaction temperature and a higher freezing temperature as compared to the gas introduced into the second sub-assembly 128.

In certain embodiments, during the start-up operation of the cooling system 124, a type of gas, such as nitrogen gas, is introduced into the first sub-assembly 126 from the input portion 134, and condensed by the heat exchanger 130 into liquid nitrogen, which fills in the container 142 through the connection tube 140. The container 142 and the connection tube 140 are cooled to the low temperature of the liquid nitrogen which is about 77 K. Accordingly, the superconducting magnet 76 is cooled close to 77 K through the thermal link 146 thermally connecting the superconducting magnet 76 and the container 142.

In one embodiment, another type of gas, such as neon gas, is introduced into the second sub-assembly 128 through the input portion 90, and condensed into liquid helium by the second-stage heat exchanger 132. The liquid helium flows through connection tubes and the magnet cooling tube 96, absorbs heat from the superconducting magnet and is vaporized into gas, which is further re-condensed into liquid when returning back to the heat exchanger 132 and circulated in the cooling path. Accordingly, the superconducting magnet 78 is further cooled close to the freezing temperature of liquid neon, which is about 25 K.

In another embodiment, another type of gas, such as helium gas, is introduced into the second sub-assembly 128 for further cooling the superconducting magnet to a lower temperature (about 4.2K). Neon gas or hellion gas may be introduced into the second sub-assembly 128 before or after that the superconducting magnet 78 is first cooled to the first stage temperature (about 77 K) by the first sub-assembly 126. The input portion 134 is closed without further introducing nitrogen gas into the first sub-assembly 126. In certain embodiments, when the superconducting magnet 78 is cooled to a freezing temperature of liquid nitrogen, which is about 63 K, container 142 and liquid nitrogen therein are cooled through the thermal link 146. Accordingly, the liquid nitrogen in the container 142 is solidified, and the connection tube 140 becomes as a vacuum tube with little heat exchange between the first stage heat exchanger 130 and the superconducting magnet 78. When the superconducting magnet 76 is further cooled down to the liquid neon or liquid helium temperature by the second sub-assembly 128, the start-up operation of the cooling system ends. During the normal cooling operation, the superconducting magnet is maintained below its superconducting temperature by continuous boiling-off and re-condensing processes of neon or helium remaining in, the closed-loop cooling path of the second-sub-assembly 128.

Figure 8:
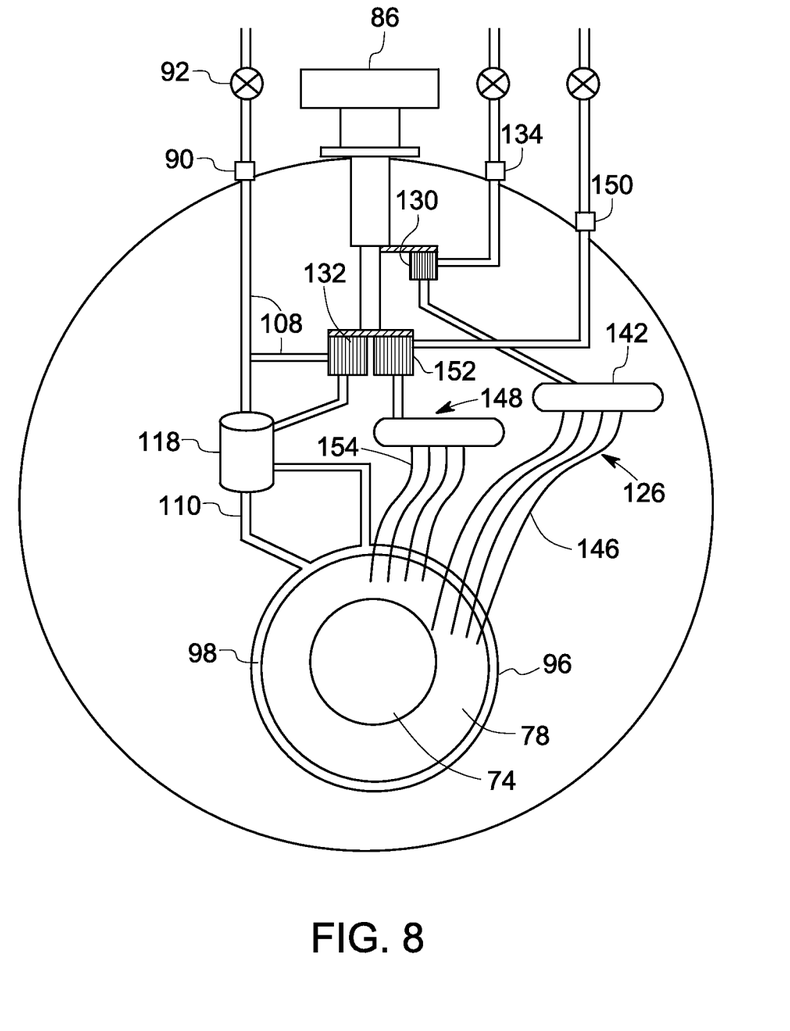
FIG. 8 is a cross-sectional view of the cooling system in FIG. 1 according to still another embodiment of the invention.

In the embodiment of FIG. 8, the cooling system 84 further comprises a third sub-assembly 148, into which a third type of gas is introduced from an input portion 150. A third heat exchanger 152 is thermally connected to the second-stage heat exchanger 132 and fluidly coupled to input portion 150 through a connection tube (not labeled) to cool or condense the gas into a liquid cryogen. A liquid cryogen container 154 is fluidly coupled to the third heat exchanger 152 for receiving the cold gas or liquid cryogen. The third sub-assembly further comprises a thermal link 156 having one end thermally contacting the liquid cryogen container 154 and another end thermally contacting the superconducting magnet 76. In one embodiment, the gas introduced through the input portion 150 is neon or hydrogen for example. Accordingly, the superconducting magnet is first cooled close to 77 K by nitrogen circulation in the first sub-assembly 126, and is then further cooled close to about 28 K by neon circulation or 14 K by hydrogen circulation in the third sub-assembly 148, and is finally cooled to about 4.2 K by helium circulation in the second sub-assembly 128. The multi-stage cooling system enables a faster start-up cooling operation of the superconducting magnet 76 by fully utilizing the cooling capacities provided by the multiple heat exchangers.

The embodiments described herein, are examples of compositions, structures, systems, and methods having elements corresponding to the elements of the invention recited in the claims. This mitten description may enable those of ordinary skill in the art to make and use embodiments having alternative elements that likewise correspond to the elements of the invention recited in the claims. The scope of the invention thus includes compositions, structures, systems and methods that do not differ from the literal language of the claims, and further includes other structures, systems and methods with insubstantial differences from the literal language of the claims. While only certain features and embodiments have been illustrated and described herein, many modifications and changes may occur to one of ordinary skill in the relevant art. The appended claims cover all such modifications and changes.

The invention claimed is:

1. A method for cooling a superconducting magnet enclosed in a cryostat of a magnetic resonance imaging system, the method comprising:
   introducing a gas into a cooling path in the cryostat from an input portion outside the cryostat;
   cooling a heat exchanger in the cooling path by a refrigerator outside the cryostat,
   wherein the heat exchanger is disposed within the cryostat,
   wherein the heat exchanger is positioned above a magnet cooling tube of the cooling path;
   cooling the gas at the heat exchanger as a cold gas or condensing the gas at the heat exchanger into a liquid cryogen;
   flowing, using gravity, the cold gas or liquid cryogen from the heat exchanger through at least a connection tube to the magnet cooling tube which is in thermal contact with the superconducting magnet;
   removing heat from the superconducting magnet by warming the cold gas into warm gas or by boiling the liquid cryogen into boiled-off gas;
   transmitting the warm gas or boiled-off gas back to the heat exchanger to re-cool the warm vas or re-condense the boiled-off gas for further cooling the superconducting magnet to a superconducting temperature;
   closing the input portion to make the cooling path as a closed-loop for maintaining the superconducting, magnet below the superconducting temperature;
   cooling a second heat exchanger disposed within the cryostat and positioned above a liquid cryogen container by the refrigerator outside the cryostat;
   introducing a second type of gas through a second inlet outside the cryostat, wherein the second type of gas has a higher liquefaction temperature than the said gas;
   cooling the second type of gas at the second heat exchanger for cooling or condensing the second type of gas into a second type of cold vas or a liquid cryogen;
   flowing, using gravity, the second type of cold gas or liquid cryogen to the liquid cryogen container through a connection tube between the second heat exchanger and the liquid cryogen container; and
   removing heat of the superconducting magnet through a thermal link having one end thermally contacting the liquid cryogen container and another end thermally contacting the superconducting magnet.

2. The method of claim 1, wherein the gas introduced into the cooling path is selected from nitrogen, neon, hydrogen, helium, or an combination thereof.

3. The method of claim 1, wherein flowing the cold gas or liquid cryogen from the heat exchanger through at least a portion of a magnet cooling tube comprises flowing the cold gas or liquid cryogen into a first opening of the magnet cooling tube through a first connection tube, and wherein transmitting the warm gas or boiled-off gas back to the heat exchanger comprises transmitting the warm gas or boiled-off gas from a second opening of the magnet cooling tube to the heat exchanger through a second connection tube.

4. The method of claim 3, wherein transmitting the warm gas or boiled-off gas from the second opening of the magnet cooling tube to the heat exchanger through said second connection tube comprises transmitting, the warm gas or boiled-off gaseous cryogen from the second opening through the second connection tube and into a cryogen reservoir within the cryostat.

5. The method of claim 3, wherein the cold gas or liquid cryogen flowing from the heat exchanger to the magnet cooling tube and the warm gas or boiled-off gas flowing from the magnet cooling tube to the heat exchanger both flow through a cryogen reservoir.

6. The method of claim 1, wherein the thermal link comprises a thermally conductive plate.

7. The method of claim 1, wherein said gas is helium, and said second type of gas is selected from nitrogen, neon, hydrogen, or any combination thereof.

8. A cooling system for a superconducting magnet comprising;
   a first sub-assembly comprising:
      a first-stage heat exchanger communicating with a first inlet portion through a connection tube;
      a liquid container communicating with the first-stage heat exchanger through a connection tube;
      a first type of cryogen in the first sub-assembly; and
      a thermal link having one end thermally contacting with the liquid container and another end thermally contacting with the superconducting magnet; and
   a second-subassembly comprising:
      a second-stage heat exchanger communicating with a second inlet portion through a connection tube;
      a magnet cooling tube having a cryogen passage and thermally contacting the superconducting magnet, the magnet cooling tube having at least one opening fluidly coupled with the second-stage heat exchanger through connection tubes; and a second type of cryogen flowing through the magnet cooling tube, wherein the first and second cryogens are different;

wherein the first-stage heat exchanger is positioned above the liquid container and disposed within a cryostat surrounding the superconducting magnet;

wherein the second-stage heat exchanger is disposed within the cryostat and positioned above a magnet cooling tube of a cooling path; and wherein the second cryogen has a liquefaction temperature which is lower than a liquefaction temperature of the first cryogen.

9. The system of claim 8, wherein the freezing temperature of the second type of cryogen is lower than the freezing temperature of the first type of cryogen.

10. The system of claim 8, wherein the thermal link comprises a thermally conducting plate.

11. The system of claim 8, wherein the first liquid container is located below the first-stage heat exchanger.

12. The system of claim 8, wherein the second-subassembly further comprises a cryogen reservoir fluidly coupled to the second-stage heat exchanger and the cryogen passage of the magnet cooling tube.

13. The system of claim 12, wherein at least one of the first and second openings of the magnet cooling tube is fluidly coupled to the second-stage heat exchanger through the cryogen reservoir.

14. The system of claim 8, wherein the magnet cooling tube comprises a first and a second opening fluidly coupled with the second-stage heat exchanger through connection tubes.

15. The system of claim 14 further comprises a refrigerator thermally coupled to both of the first-stage heat exchanger and the second-stage heat exchanger.

16. The system of claim 8 further comprising a third sub-assembly comprising:

a third heat exchanger coupled to a third inlet portion through a connection tube;

a third liquid container coupled to the third heat exchanger through, at least one connection tube;

a third type of cryogen in the third sub-assembly; and a thermal link having one end thermally coupled to the third liquid container and another end thermally coupled to the superconducting magnet, wherein the third type of cryogen is different from the first and second type of cryogens.

17. The system of claim 16, wherein the third heat exchanger thermally contact with the second-stage heat exchanger.

* * * * *

UNITED STATES PATENT AND TRADEMARK OFFICE
CERTIFICATE OF CORRECTION

PATENT NO. : 8,544,281 B2
APPLICATION NO. : 12/913802
DATED : October 1, 2013
INVENTOR(S) : Zhang et al.

It is certified that error appears in the above-identified patent and that said Letters Patent is hereby corrected as shown below:

In the Specification:

In Column 1, Line 8, delete "and," and insert -- and --, therefor.

In Column 1, Line 21, delete "in" and insert -- in, --, therefor.

In Column 1, Line 53, delete "or," and insert -- or --, therefor.

In Column 1, Line 62, delete "superconducting," and insert -- superconducting --, therefor.

In Column 2, Line 13, delete "cooling," and insert -- cooling --, therefor.

In Column 2, Lines 20-21, delete "DRAWING FIGURES" and insert -- DRAWINGS/FIGURES --, therefor.

In Column 2, Line 26, delete "characters," and insert -- characters --, therefor.

In Column 2, Line 37, delete "to," and insert -- to --, therefor.

In Column 2, Line 58, delete "for cooling" and insert -- for cooling a --, therefor.

In Column 3, Line 28, delete "42" and insert -- 42, --, therefor.

In Column 4, Line 5, delete "here" and insert -- where --, therefor.

In Column 4, Line 16, delete "thermal," and insert -- thermal --, therefor.

In Column 4, Line 27, delete "8Z" and insert -- 82, --, therefor.

Signed and Sealed this
Nineteenth Day of November, 2013

Teresa Stanek Rea
*Deputy Director of the United States Patent and Trademark Office*

CERTIFICATE OF CORRECTION (continued)

In Column 4, Line 62, delete "pressure," and insert -- pressure --, therefor.

In Column 5, Line 29, delete "and oblique" and insert -- an oblique --, therefor.

In Column 5, Line 50, delete "embodiment" and insert -- embodiment, --, therefor.

In Column 5, Line 51, delete "embodiment" and insert -- embodiment, --, therefor.

In Column 5, Line 58, delete "tub" and insert -- tube --, therefor.

In Column 5, Line 59, delete "gravity by the" and insert -- by the gravity --, therefor.

In Column 5, Line 62, delete "tube 90." and insert -- tube 96. --, therefor.

In Column 6, Line 1, delete "104;" and insert -- 104, --, therefor.

In Column 6, Line 6, delete "close," and insert -- close --, therefor.

In Column 6, Line 31, delete "refereed" and insert -- referred --, therefor.

In Column 6, Line 53, delete "surfaced" and insert -- surface attached --, therefor.

In Column 6, Line 65, delete "fine," and insert -- fine --, therefor.

In Column 7, Line 18, delete "<condensed" and insert -- condensed --, therefor.

In Column 8, Line 53, delete "first cooled" and insert -- first cooled close --, therefor.

In Column 9, Line 3, delete "in," and insert -- in --, therefor.

In Column 9, Line 14, delete "haying" and insert -- having --, therefor.

In Column 9, Line 28, delete "herein," and insert -- herein --, therefor.

In Column 9, Line 31, delete "mitten" and insert -- written --, therefor.

In the Claims:

In Column 9, Line 67, in Claim 1, delete "vas" and insert -- gas --, therefor.

In Column 10, Line 4, in Claim 1, delete "superconducting," and insert -- superconducting --, therefor.

In Column 10, Line 14, in Claim 1, delete "vas" and insert -- gas --, therefor.

CERTIFICATE OF CORRECTION (continued)
U.S. Pat. No. 8,544,281 B2

In Column 10, Line 25, in Claim 2, delete "or an" and insert -- or any --, therefor.

In Column 10, Line 38, in Claim 4, delete "transmitting," and insert -- transmitting --, therefor.

In Column 10, Lines 52-53, in Claim 8, delete "comprising;" and insert -- comprising: --, therefor.

In Column 12, Line 16, in Claim 16, delete "through," and insert -- through --, therefor.